US009459317B2

(12) United States Patent
Abouda et al.

(10) Patent No.: US 9,459,317 B2
(45) Date of Patent: Oct. 4, 2016

(54) MIXED MODE INTEGRATED CIRCUIT, METHOD OF PROVIDING A CONTROLLABLE TEST CLOCK SIGNAL TO A SUB-CIRCUITRY OF THE MIXED-MODE INTEGRATED CIRCUIT AND METHOD OF DETECTING CURRENT PATHS CAUSING VIOLATIONS OF ELECTROMAGNETIC COMPATIBILITY STANDARDS IN THE MIXED MODE INTEGRATED CIRCUIT

(71) Applicants: Pascal Kamel Abouda, Saint Lys (FR); Celine Hounaïda Abouda, Saint Lys (FR); Patrice Besse, Tournfeuille (FR)

(72) Inventors: Pascal Kamel Abouda, Saint Lys (FR); Celine Hounaïda Abouda, Saint Lys (FR); Patrice Besse, Tournfeuille (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/607,798

(22) Filed: Jan. 28, 2015

(65) Prior Publication Data
US 2016/0061891 A1 Mar. 3, 2016

(30) Foreign Application Priority Data

Aug. 28, 2014 (WO) .................. PCT/IB2014/002006

(51) Int. Cl.
*H04L 7/00* (2006.01)
*G01R 31/317* (2006.01)
*G01R 31/3167* (2006.01)

(52) U.S. Cl.
CPC ..... *G01R 31/31727* (2013.01); *G01R 31/3167* (2013.01)

(58) Field of Classification Search
CPC .................... G01R 31/3177; G01R 31/31727; G01R 31/3167
See application file for complete search history.

(56) References Cited

U.S. PATENT DOCUMENTS 5,506,851 A * 4/1996 Fuse .................. G06F 11/2733
324/750.3
8,290,109 B2 10/2012 Li
(Continued)

FOREIGN PATENT DOCUMENTS

CN 102636209 A 8/2012
WO 2006/082555 A1 8/2006

OTHER PUBLICATIONS

Bascoul, G, et al, "Time Resolved Imaging: From logical sates to events, a new and efficient pattern matching method for VLSI analysis", Proceedings of the 22th European Symposium on the Reliability of Electron Devices, Failure Physics and Analysis; Microelectronics Reliability, vol. 51, issues 9-11; Sep.-Nov. 2011, pp. 1640-1645.

*Primary Examiner* — Syed Haider
(74) *Attorney, Agent, or Firm* — Charlene R. Jacobsen (57) ABSTRACT

A mixed mode integrated circuit, a method of providing a controllable test clock signal to a sub-circuitry of the mixed-mode integrated circuit and a method of detecting current paths causing violations of electromagnetic compatibility standards in the mixed mode integrated circuit are provided. The mixed mode integrated circuit 100 comprises in addition to a clock network 110 an integrated test clock signal generator 140 to generate test clock signals that are provided via controllable multiplexers 150, 160 to an analog and digital sub-circuitry, respectively, of the mixed-mode integrated circuit. The test clock signals are generated on basis of an input test clock signal having a controllable frequency. The clock network generates clock signals for the sub-circuitries that are used by the sub-circuitries under normal operational conditions. The controllable multiplexers provide either the test clock signal to a specific sub-circuitry or a clock signal received from the clock network.

17 Claims, 5 Drawing Sheets

(56) References Cited

U.S. PATENT DOCUMENTS

| | | | |
|---|---|---|---|
| 2003/0093730 A1* | 5/2003 | Halder | G01R 31/3167 714/724 |
| 2003/0163775 A1* | 8/2003 | Reese | G01R 1/025 714/752 |
| 2005/0065747 A1* | 3/2005 | Premy | G01R 31/3167 702/120 |
| 2005/0114550 A1* | 5/2005 | Kushnick | G01R 1/0408 709/248 |
| 2008/0133167 A1 | 6/2008 | Fleury et al. | |
| 2011/0060933 A1* | 3/2011 | Iwamoto | G01R 31/31907 713/400 |
| 2012/0229146 A1* | 9/2012 | Ting | G01R 31/31932 324/617 |
| 2013/0064334 A1 | 3/2013 | Rofougaran | |

* cited by examiner

MIXED MODE INTEGRATED CIRCUIT, METHOD OF PROVIDING A CONTROLLABLE TEST CLOCK SIGNAL TO A SUB-CIRCUITRY OF THE MIXED-MODE INTEGRATED CIRCUIT AND METHOD OF DETECTING CURRENT PATHS CAUSING VIOLATIONS OF ELECTROMAGNETIC COMPATIBILITY STANDARDS IN THE MIXED MODE INTEGRATED CIRCUIT

CROSS REFERENCE TO RELATED APPLICATION(S)

The present application claims priority to International Patent Application No. PCT/IB2014/002006, entitled "MIXED MODE INTEGRATED CIRCUIT, METHOD OF PROVIDING A CONTROLLABLE TEST CLOCK SIGNAL TO A SUB-CIRCUITRY OF THE MIXED-MODE INTEGRATED CIRCUIT AND METHOD OF DETECTING CURRENT PATHS CAUSING VIOLATIONS OF ELECTROMAGNETIC COMPATIBILITY STANDARDS IN THE MIXED MODE INTEGRATED CIRCUIT," filed on Aug. 28, 2014, the entirety of which is herein incorporated by reference.

FIELD OF THE INVENTION

This invention relates to the field of mixed mode integrated circuits and integrated circuit layouts (designs) of such mixed mode Integrated Circuits that are adapted for Electromagnetic Compatibility (EMC) testing. The invention further relates to method of providing a controllable test clock signal to a sub-circuitry of a mixed-mode integrated circuit, a method of detecting current paths causing violations of electromagnetic compatibility standards in a mixed mode integrated circuit, a computer program product, a non-transitory tangible computer readable medium, and a simulation system

BACKGROUND OF THE INVENTION

All electronic devices, and the integrated circuits used in those devices, have to Electromagnetic Compatible. The electronic devices and their circuitries may emit electromagnetic radiation and it has been defined by standardization organizations within which boundaries electromagnetic radiation may be emitted. An operation of circuitries and integrated circuits of the electronic device may also be influenced by electromagnetic radiation and it has been defined within which amount of ambient electromagnetic radiation the electronic devices should operate errorless.

To guarantee that designed integrated circuits operate well within the limits defined by the standardization organizations, designers of an integrated circuit design have to perform ElectroMagnetic Compatibility (EMC) tests. These EMC tests are often performed by means of simulations of the EMC behaviour of the integrated circuit to detect which current paths contribute to a too large extent to the radiation of electromagnetic energy or which current paths are to a too large extent susceptible for ambient electromagnetic radiation.

It is quite complicated to perform the simulations and EMC tests for integrated circuit designs that represent a fully digital circuitry. On top of that, when the integrated circuit design is a mixed mode circuitry, it becomes much more complicated because analogue and digital circuitries are combined on one device and, in general, quite a lot of the analogue circuitries comprise very noisy sub-circuitries like charge pumps, buck boost converters, sepic converters, other dc/dc converters, etc., and quite a lot of analogue circuitries comprise very accurate sub-circuitries, like voltage and current references, sense amplifiers, analogue-to-digital converters, etc. In such a mixed mode environments, traditional ways of performing EMC tests, like analysing inter modulation and parasitic coupling paths, become very difficult.

SUMMARY OF THE INVENTION

The present invention provides a mixed mode integrated circuit, an integrated circuit design, a method of providing a controllable test clock signal to a sub-circuitry of a mixed-mode integrated circuit, a method of detecting current paths causing EMC problems in a mixed mode integrated circuit, a computer program product, a non-transitory tangible computer readable medium, and a simulation system as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. In the Figures, elements which correspond to elements already described may have the same reference numerals.

DETAILED DESCRIPTION OF THE PREFERRED EMBODIMENTS

In the following, for sake of understanding, the circuitry is described in operation. However, it will be apparent that the respective elements are arranged to perform the functions being described as performed by them.

Figure 1:
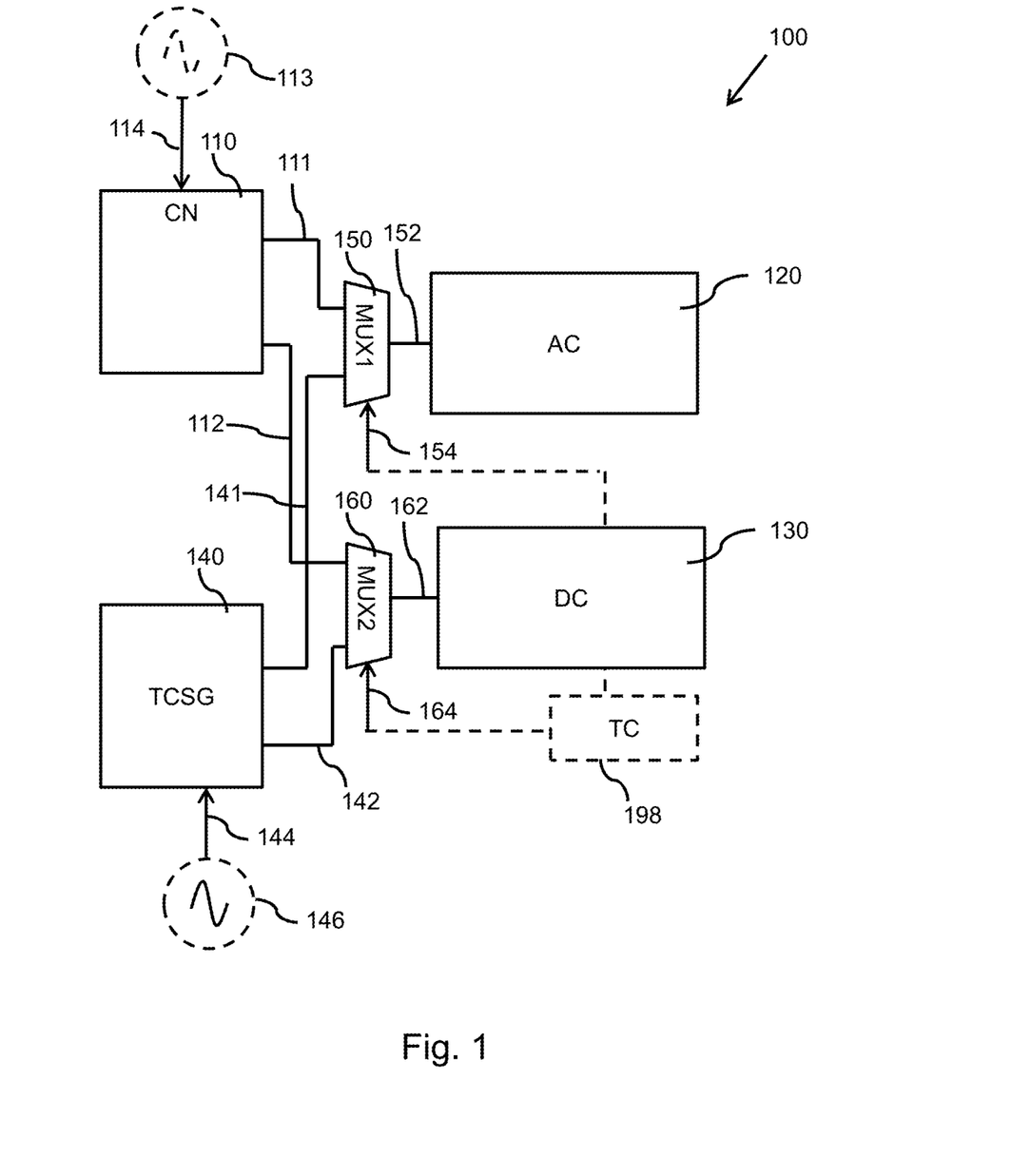
FIG. 1 schematically shows an example of an embodiment of a mixed mode integrated circuit, FIG. 2 schematically shows an example of an embodiment of the integrated test clock signal generator, FIG. 3 schematically shows an example of an embodiment of a mixed mode integrated circuit, FIG. 4 schematically shows an example of an embodiment of a method of providing a controllable test clock signal to sub-circuitry of a mixed mode integrated circuit and an example of an embodiment of a method of detecting current paths causing EMC problems in a mixed mode integrated circuit, FIG. 5 schematically shows an example of an embodiment of an user interaction system.

FIG. 1 schematically shows an example of an embodiment of a mixed mode integrated circuit 100 that is adapted for electromagnetic compatibility testing. The mixed mode integrated circuit comprises an analogue sub-circuitry AC, 120, a digital sub-circuitry DC, 130, a clock network CN, 110, an integrated test clock signal generator TCSG, 140, a first controllable clock multiplexer MUX1, 150, and a second controllable multiplexer MUX2, 160.

The analogue sub-circuitry AC, 120 performs an analogue circuit operation. For example, the analogue sub-circuitry AC, 120 may be one of a charge pump, a converter (such as, for example, a buck boost converter, a sepic converter or other types of, for example dc/dc, converters), a circuitry that provides a reference (for example, a current reference or a voltage reference), an amplifier for amplifying analogue signals, analogue-to-digital/digital-to-analogue converters, analogue comparators, Schmidt triggers and buffers, high side drivers, low side drivers and measurement functions. The digital sub-circuitry DC, 130 performs a digital circuit operation. It basically means that signals that are processed by the digital sub-circuitry DC, 130 are signals that represent discrete values such as, for example 0 and 1.

The clock network CN, 110 comprises a clock input for receiving a clock signal 114 and is arranged to provide a first clock signal 111 to the analogue sub-circuitry AC, 120 and a second clock signal 112 to the digital sub-circuitry DC, 130. The clock signal 114 may be generated by an oscillator that is either provided in the mixed mode integrated circuitry or is an external oscillator 113 and the external oscillator 113 is coupled to a pin of the mixed mode integrated circuit and this pin is subsequently coupled to the clock input of the clock network CN, 110. The clock signal 114 may have a predefined frequency that is required for a normal operation of the mixed mode integrated circuit. The first clock signal 111 and the second clock signal 112 are not by definition exactly equal to the clock signal 114. One of the first clock signal 111 and the second clock signal 112 may be derived from the clock signal 114. Also both clock signals 111, 112 may be derived from the clock signal 114. The clock network CN, 110 may comprise frequency dividers and/or frequency multipliers for generating a specific frequency for at least one of the first clock signal 111 and the second clock signal 112. The clock network CN, 110 may also comprise one or more delay networks delaying a phase of the first clock signal 111 and/or of the second clock signal 112. At least the first clock signal 111 and the second clock signal 112 are generated such that, when the mixed mode integrated circuit operates under normal conditions (e.g. when it is not in a test mode), the analogue sub-circuitry AC, 120 and the digital sub-circuitry DC, 130 receive a clock signal that allows them to operate normally. Thus, the generated first clock signal 111 and the generated second clock signal 112 fulfil a certain predefined specification that forms a basis for a normal operation of the sub-circuitries 120, 130.

The integrated test clock signal generator TCSG, 140 is arranged to generate a first test clock signal 141 and a second test clock signal 142 on basis of an input test clock signal 144. Thus, the integrated test clock signal generator TCSG, 140 comprises an input that may be coupled to an external pin of a package of the mixed mode integrated circuit. At the input the input test clock signal 144 may be received and, externally, the frequency of the provided input test clock signal 144 may be controlled. The integrated test clock signal generator TCSG, 140 may derive the first test clock signal 141 and the second clock signal 142 from the input test clock signal 144. Details of the integrated test clock signal generator TCSG, 140 are discussed later. In addition to the later discussed embodiments of the integrated test clock signal generator TCSG, 140, the integrated test clock signal generator TCSG, 140 may comprise frequency dividing sub-circuitries and/or frequency multiplying circuitries for adapting the frequency of the input test clock signal 144 before finally generating the respective test clock signal 141, 142.

The first controllable clock multiplexer MUX1, 150 has two input ports on which it receives two input signals, namely, the first clock signal 111 and the first test clock signal 141. On basis of a first multiplexer control signal 154 one of the specific input clock signal may be selected and via an output port a first multiplexed clock signal 152 may be provided to the analogue sub-circuitry AC, 120. The first controllable clock multiplexer MUX1, 150 may comprise two controllable switches. One of the controllable switches may be coupled between one of the input ports and the output port and the other one of the controllable switches may be coupled between another one of the input ports and the output port. The controllable switches may be controlled by the first multiplexer control signal 154 such that only one of the controllable switches is open at a specific moment in time. The first multiplexer control signal 154 may be generated by a test controller 198 of the mixed mode integrated circuit. The test controller 198 is activated when the mixed mode circuitry is tested and the test controller 198 may be arranged to provide several test functions of the mixed mode integrated circuit. One of the possible test is an EMC test as discussed in this document. The test controller 198 may have control registers that can be controlled by a user of the mixed mode integrated circuit. A predefined bit of a predefined control register may determine the first multiplexer control signal 154. It is to be noted that later in this document also specific controllers are discussed which might be integrated with the test controller 198 as discussed above or which might be a separate controller.

The second controllable clock multiplexer MUX2, 160 has two input ports on which it receives two input signals, namely, the second clock signal 112 and the second test clock signal 142. On basis of a second multiplexer control signal 164 one of the specific input clock signal may be selected and via an output port a second multiplexed clock signal 162 may be provided to the digital sub-circuitry DC, 130. Embodiments of the second controllable clock multiplexer MUX2, 160 may be similar to embodiments of the first controllable clock multiplexer MUX1, 150. The second multiplexer control signal 164 may be also be generated by the above discussed test controller 198 and the second multiplexer control signal 164 may be generated in dependency of another predefined bit of another predefined register of the same predefined register of the test controller 198.

The above discussed mixed-mode integrated circuit 100 can be controlled, when it operates in a test mode, to provide a specific test clock signal 141, 142 to at least one of the analogue sub-circuitry AC, 120 and the digital sub-circuitry DC, 130 via respective multiplexers MUX1, 150, MUX2, 160. This has a specific advantage. In many mixed-mode circuitries, the "normal" clock signals received by the sub-circuitries 120, 130 are strongly correlated. When the provided test clock signal is different from the clock signal 111, 112 that is normally provided to specific sub-circuitries it is easier to distinguish between EMC effect of the analogue sub-circuitry AC, 120 and of the digital sub-circuitry DC, 130 because the individual effects can be measured and correlated to individual clock signals. By operating at least one of the sub-circuitries 120, 130 at another frequency, or on basis of a clock signal that has another phase, one can better distinguish between the EMC effects of each separate sub-circuitry 120, 130. Thus, the EMC emission of each internal sub-circuitry can be better characterized. Because an external input clock signal 144 may be used to generate the test clock signal 141, 142, the above mixed mode integrated circuit can also be analysed with other advanced analysis technologies such as TRI analysis since the TRI analysis may be synchronized to the external input clock signal 144 or to edges of the external input clock signal 144.

TRI (Time Resolve Imaging) allows real time imaging of transitions in CMOS gates even for very deep submicron technologies at low power supply voltage. The measured timing information differs from waveform measurement where logical states are easily extracted. At first logical event is introduced with a 1 value when we have transition from one logical state to its complement (0-1 or 1-0) or 0 value when there is no change between 2 vectors. Events can be extracted from TRI database and then used for a very accurate and efficient pattern matching method. Time resolved Imaging is an extension of microscope luminescence measurements into the temporal domain providing the possibility of determining time-resolved properties of microscope samples and their surrounding environments, and thereby extends the conventional steady state measurements. 'Time resolved imaging microscopy' is a relatively new technique whereby fast kinetic and luminescence decay parameters (decay times and the corresponding time or phase resolved amplitudes) are directly and simultaneously measured throughout an image, pixel by pixel, in an optical microscope. Molecular rotation, solvent and matrix relaxation, quenching mechanisms, reactions, and energy transfer are examples of molecular spectroscopic processes that can be studied best by directly measuring the time dependent properties. Dynamic measurements are generally much more informative than their steady state counterparts. The invention allow to develop time-resolved analysis methods that can be applied to mixed mode integrated circuits. Thereby a better insight can be obtained to which current paths in the mixed mode integrated circuit 100 contributes to EMC problems.

FIG. 1 shows a mixed mode integrated circuit 100 with one analogue sub-circuitry AC, 120 and one digital sub-circuitry DC, 130. It is to be noted that embodiments of the mixed mode integrated circuit 100 are not limited to such numbers of sub-circuitries AC, DC, 120, 130. In practical embodiments, the mixed mode circuit 100 comprises a plurality of analogue sub-circuitries AC, 120 and a plurality of digital sub-circuitries DC, 130. With a plurality of analogue sub-circuitries AC, 120 and a plurality of digital sub-circuitries DC, 130, the clock network CN, 110 is arranged to generate more than two clock signal 111, 112, for example, a specific clock signal for each sub-circuitry AC, 120, DC, 130, or a number of clock signals that is smaller than the number of sub-circuitries AC, 120, DC, 130, but larger than two when specific sub-circuitries share the same clock signal. With a plurality of analogue sub-circuitries AC, 120 and a plurality of digital sub-circuitries DC, 130, the integrated test clock signal generator TCSG, 140 generates more than two test clock signals 141, 142, for example, a test clock signal for each sub-circuitry, or a number of clock signals that is smaller than the number of sub-circuitries and is larger than two when specific sub-circuitries share the same test clock signal. With a plurality of analogue sub-circuitries AC, 120 and a plurality of digital sub-circuitries DC, 130 the mixed mode integrated circuit may also comprise more than two controller clock multiplexers MUX1, 150, MUX2, 160. Depending on the number of sub-circuitries and depending on how the sub-circuitries need to be tested for EMC problems (for example, to be tested individually or in groups), the number of controllable multiplexers may be equal to or smaller than the number of sub-circuitries and larger than 2. When the number of sub-circuitries AC, 120, DC, 130 becomes relatively large, it is even more difficult to detect which sub-circuitry contributes to possible EMC problems. All sub-circuitries may influence each other and all sub-circuitries may pick up EM radiation from the environment or from other sub-circuitries. Thus using test clock signals and provide them to sub-circuitries that must be tested is even more beneficial because a very complex EMC test can be split up into sub-tests that each focus on a specific sub-circuitry of a group of sub-circuitries. Each sub-test can distinguish between the EMC problems of the tested sub-circuitries (or group of sub-circuitries) and the other sub-circuitries of the mixed mode integrated circuit.

Figure 2:
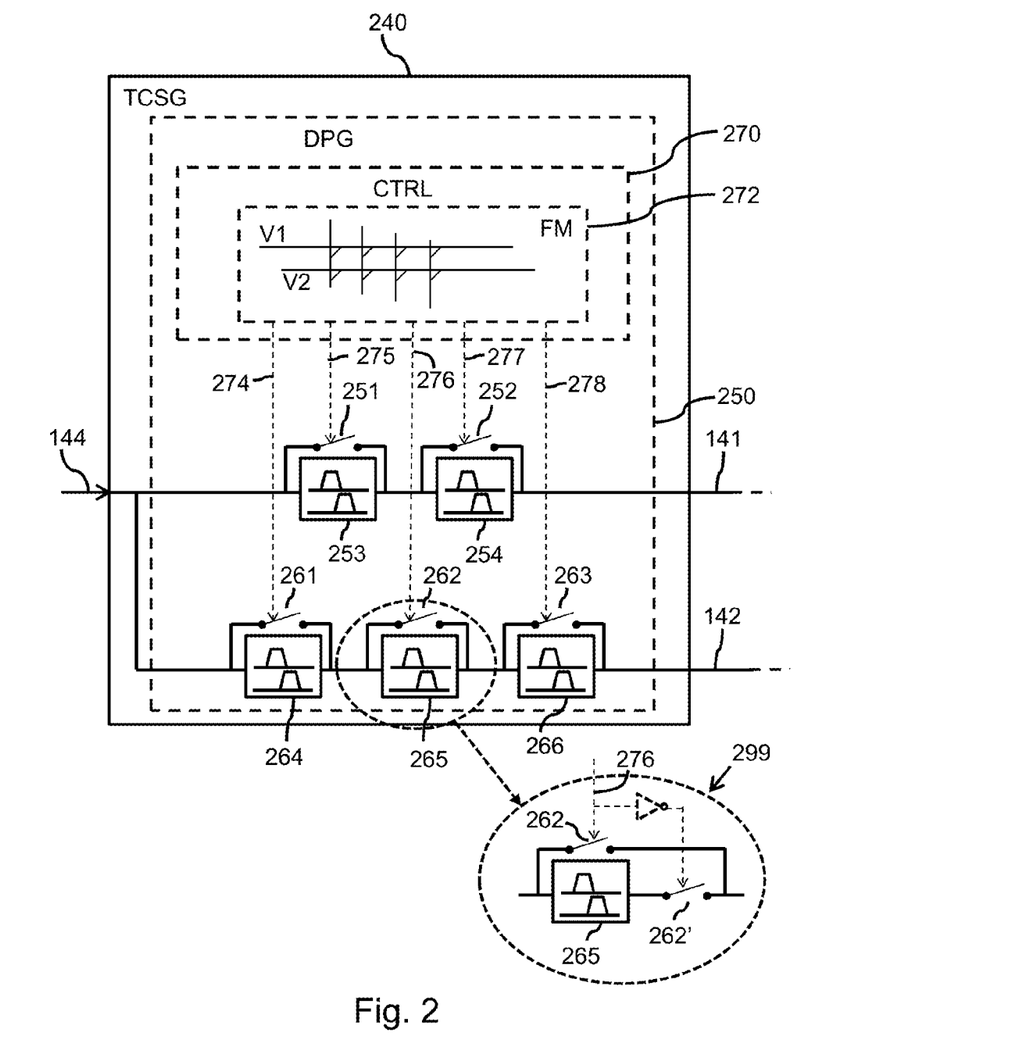

FIG. 2 schematically shows an example of an embodiment of the integrated test clock signal generator TCSG, 240. The integrated test clock signal generator TCSG, 240 comprises a delay phasing generator DPG, 250 that is arranged to control a phase of the first test clock signal 141 and/or the second test clock signal 142. Note that the phase is controlled with respect to the input test clock signal 144. The delay phasing generator DPG, 250 provides the possibility to generate first test clock signals 141 and/or second test clock signals 142 that have a specific phase. Thereby, when performing EMC tests, it can be better detected which current paths contribute to EMC problems and, by slightly changing the phase of at least one of the test clock signals it may be tested whether introducing additional delays in the clock network CN, 110 at least partially solves the EMC problems. For example, when two sub-circuitries (e.g. the analogue sub-circuitry AC, 120 and the digital sub-circuitry DC, 130) receive synchronous clock signals, it may be that this leads to an EMC problem and by changing the phase of one of the test clock signals one can test whether this results in a better spread spectrum emission that is to a smaller extent subject of EMC problems.

In an embodiment of the delay phasing generator DPG, 250, a first series of clock delay circuitries 253, 254 is provided and coupled between the input receiving the input test clock signal 144 and one of the outputs that provides the first test clock signal 141. Each clock delay circuitry 253, 254 is capable of delaying the input clock signal for a certain amount of time thereby changing the phase of the first test clock signal 141 with respect to the input clock signal 144. The delay phasing generator also comprises a plurality of controllable switches 251, 252. The number of controllable switches 251, 252 may be equal to the number of clock delay circuitries 253, 254. The controllable switches 251, 252 are coupled parallel to the clock delay circuitries 253, 254 for short circuiting an input and an output of the one specific clock delay circuitry in dependence of a control signal from a first set of control signals 275, 277. In other words, pairs of one controllable switch 251, 252 and one clock delay circuitry 253, 254 are formed and the controllable switch 251, 252 of a specific pair is coupled parallel to the clock delay circuitry 253, 254 of the specific pair. When a specific controllable switch 251, 252 is closed (which means, controlled in the conducting state), the clock signal is able to pass the clock delay circuitry 253, 254 to which the specific controllable switch 251, 252 is coupled and is therefore not delayed by that clock delay circuitry 253, 254. By controlling all controllable switches 251, 252 in the conducting state, the input clock signal 144 is not delayed and a phase of the first test clock signal 141 has no phase difference with respect to the input clock signal 144. When the controllable switches 251, 252 are in the non-conducting state, the first test clock signal 141 has a maximum delay with respect to the input clock signal 144—depending on the actual value of the delay and the frequency of the input clock signal 144 a specific phase difference is obtained between the input clock signal 144 and the first test clock signal 141. The first set of control signals 275, 277 is received from a controller CTRL, 270 that may be arranged to control the controllable switches 251, 252 when the mixed mode integrate circuit (e.g. mixed mode integrated circuit 100 of FIG. 1) is being tested for EMC problems.

In line with the above discussed first series arrangement of clock delay circuitries 253, 254 the delay phasing generator DPG, 250 may also comprise a second series arrangement of clock delay circuitries 264, 265, 266. The second series arrangement of clock delay circuitries 264, 265, 266 is coupled between an input of the delay phasing generator DPG, 250 where the input clock signal 144 is received and one of the outputs where the second test clock signal 142 is provided. A plurality of further controllable switches 261, 262, 263 is provided and, in line with the discussion above, pairs of further controllable switches 261, 262, 263 and clock delay circuitries 264, 265, 266 are formed. The further controllable switch 261, 262, 263 of the pair is coupled parallel to the clock delay circuitry 264, 265, 266 of the pair such that, when the further controllable switch 261, 262, 263 is controlled in the conducting mode, the input and the output of the clock delay circuitry 264, 265, 266 is short-circuited. The further controllable switches 261, 262, 263 each receive a control signal 274, 276, 278 from a second set of control signal that may be generated by the controller CTRL, 270. The controllable switches 261, 262, 263 and the second series arrangement of clock delay circuitry 264, 265, 266 may have the same embodiments and may operate in an equal way as the controllable switches 251, 252 and the first series of controllable switches 261, 262, 263.

At the right bottom end of FIG. 2 an alternative (practical) configuration 299 is shown for the configuration of a pair of a clock delay circuitry 265 and its controllable switch 262. When the clock delay circuitry 265 is not resistant to being short-circuited, an additional controllable switch 262' may be provided in the output path (or, alternatively, in the input path—this configuration is not shown) of the clock delay circuitry 265. The additional controllable switch 262' receives an inverse of the control signal 276 that controls the controllable switch 262. Thus, in other words, either the controllable switch 262 is conducting or the additional controllable switch 262' is conducting. This alternative configuration 299 may be used for all pairs of clock delay circuitries 253, 254, 264, 265, 266 and their respective controllable switch 251, 252, 261, 262, 263.

In an embodiment of the controller CTRL, 270 of the delay phasing generator DPG, 250, the controller CTRL, 270 may comprise a fuse-matrix FM, 272 that is arranged to couple the control signals 275, 277 of the first set of control signals and/or the control signals 274, 276, 278 of the second set of control signals to a first control voltage V1 or to a second control voltage V2. The respective controllable switches 251, 252, 261, 262, 263 are, for example, controlled in a conducting mode when they receive the first control voltage V1 and are, for example, controlled in the non-conducting mode when they receive the second control voltage V2. The first control voltage V1 may be one of the ground voltage and the supply voltage and the second control voltage V1 may be another one of the ground voltage and the supply voltage. Depending on the implementation of the controllable switches 251, 252, 261, 262, 263, also other control voltages may be used. The fuse-matrix FM, 272 comprises fuses that can be controlled in a non-conducting state by providing a (too) high current to the respective fuses. The fuse-matrix FM, 272 may be implemented according to known implementations of such matrices. The controller CTRL, 270 may be integrated with the test controller TC, 198 of FIG. 1 or may be a separate controller CTRL, 270.

Figure 3:
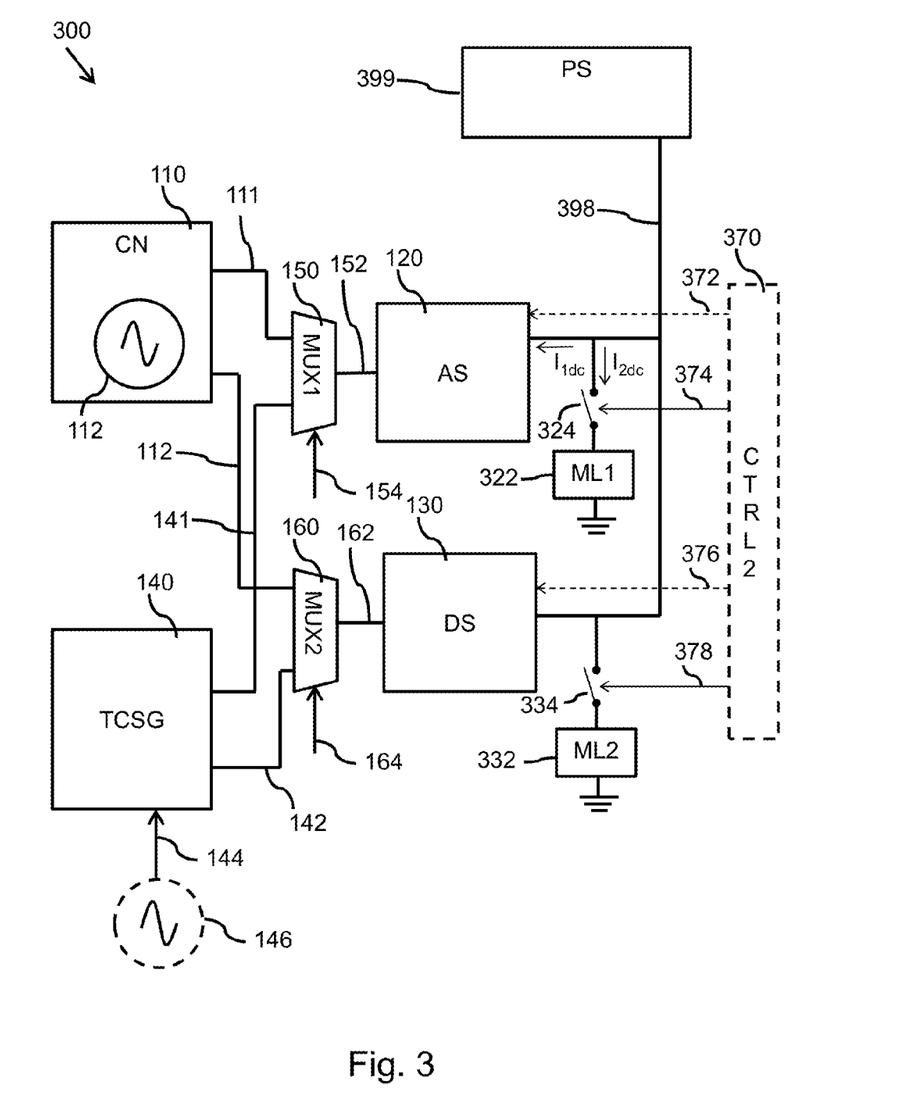

FIG. 3 schematically shows an example of an embodiment of a mixed mode integrated circuit 300. A portion of mixed mode integrated circuit 300 is similar to the mixed mode integrated circuit 100 of FIG. 1. Similar elements of the mixed mode integrated circuit 300 have the same reference numbers as their counterparts in mixed mode integrated circuit 100 of FIG. 1. Reference is made to the description of FIG. 1 that provides examples, embodiments and functions of those elements.

The analogue sub-circuitry AS, 120 and the digital sub-circuitry DS, 130 are coupled to a power supply PS, 399 and receive power via a power line 398 from the power supply PS, 399. Under normal operational conditions, both the analogue sub-circuitry AS, 120 and the digital sub-circuitry DS, 130 provide a specific DC load to the power supply PS, 399. The respective sub-circuitries AS, 120, DS, 130 may also consume an amount of power that has an AC behaviour. In the context of this document, only the DC component of the power consumption of the sub-circuitries AS, 120, DS, 130 is relevant. For example, the power supply PS, 399 may provide a specific supply voltage and under the normal operational conditions, the analogue sub-circuitry AS, 120 consumes a specific DC current $I_{1dc}$. The mixed mode integrated circuit comprises a first matched load ML1, 322 and a second matched load ML2, 332. The first matched load ML1, 322 has a specifically selected impedance such that the first matched load ML1, 322 provides to the power supply PS, 399, when being coupled to the power supply PS, 399, a DC load (e.g. $I_{2dc}$) that matches with the DC load that the analogue sub-circuitry AS, 120 provides to the power supply PS, 399 under normal operational conditions. The first matched load ML1, 322 is arranged in series with a first controllable switch 324 and this series arrangement is coupled between the power supply PS, 399 and a ground voltage. The second matched load ML2, 332 provides to the power supply PS, 399, when being coupled to the power supply PS, 399, a DC load that matches with the DC load that the digital sub-circuitry DS, 130 provides to the power supply PS, 399 under normal operational conditions. The second matched load ML2, 332 is arranged in series with a second controllable switch 334 and this series arrangement is coupled between the power supply PS, 399 and the ground voltage. A conducting or non-conducting state of the first controllable switch 324 and the second controllable switch 334 may be controlled by a first on/off control signal 374 and a second on/off control signal 378. Such on/off control signal 374, 378 may optionally be generated by a sub-circuitry on/off controller CTRL2, 370. The sub-circuitry on/off controller CTRL2, 370 may be arranged to switch off a specific sub-circuitry when the mixed-mode integrated circuit is tested, e.g., is in a test mode. This switching off may be done by providing to the respective sub-circuitries AS, 120, DS, 130 sub-circuitry on/off control signal 372, 376. When a sub-circuitry is switched off, the sub-circuitry on/off controller CTRL2, 370 controls one of the first and the second controllable switch in a conducting mode such that one of the matched loads ML1, 322, ML2, 332 start to consume the amount of DC power that normally consumed by the switched off sub-circuitry. For example, when the analogue sub-circuitry AS, 120 is controlled in the off state during an EMC test, the first controllable switch 324 is controlled in the conducting state such that the first matched load consumes a DC current $I_{2dc}$ that is about equal to the DC current $I_{1dc}$ that the analogue sub-circuitry AS, 120 normally consumes under normal operational conditions. Optionally, the respective matched loads ML1, 322, ML2, 332 are arranged close to their respective sub-circuitries AS, 120, DS, 130 such that during tests of the mixed-mode integrated circuit the currents through the power lines 398 are comparable to how the mixed-mode integrated circuit operates under normal operational conditions. The sub-circuitry controller CTRL2, 370 may be integrated with the test controller TC, 198 of FIG. 1 and/or the controller CTRL, 270 of FIG. 2 or is a separate controller CTRL2, 370. The sub-circuitry controller CTRL2, 370 may comprise registers that can be programmed by a user of the mixed-mode integrated circuit 300 and specific bits of the registers may provide information on basis of which the on/off control signal 372, 374, 376, 378 are generated.

The matched loads ML1, 322, ML2, 332 provide the possibility to prevent that during EMC tests the results are influenced too much by a situation in which the power supply PS, 399 has to deliver less power than under normal operational conditions and a situation in which the power line 398 conducts a significantly smaller amount of power. It is important for the EMC tests that the currents that flow through the different circuitries and power lines 398 are about equal to the normal operational conditions. Thus, the matched load ML1, 322, ML2, 332 enable a better characterization of individual sub-circuitries of the mixed-mode integrated circuit 300 compared to a situation where such matched loads ML1, 322, ML2, 332 are not present.

In the context of FIGS. 1, 2 and 3, a mixed-mode integrated circuit has been discussed. Such circuits are manufactured on basis of a design of the integrated circuit. Thus, specific embodiments (not shown separately, but may also be represented by FIGS. 1, 2 and 3) relate to an integrated circuit design that is a design for one of the above discussed embodiments of the mixed-mode integrated circuit. The integrated circuit design may comprise a high level behavioural description of the mixed-mode integrated circuit and/or may comprise the physical layout of the mixed-mode integrated circuit. Also levels of abstraction in between the physical layout and the high level behavioural description may be part of the integrated circuit design of the mixed mode integrated circuit.

Figure 4:
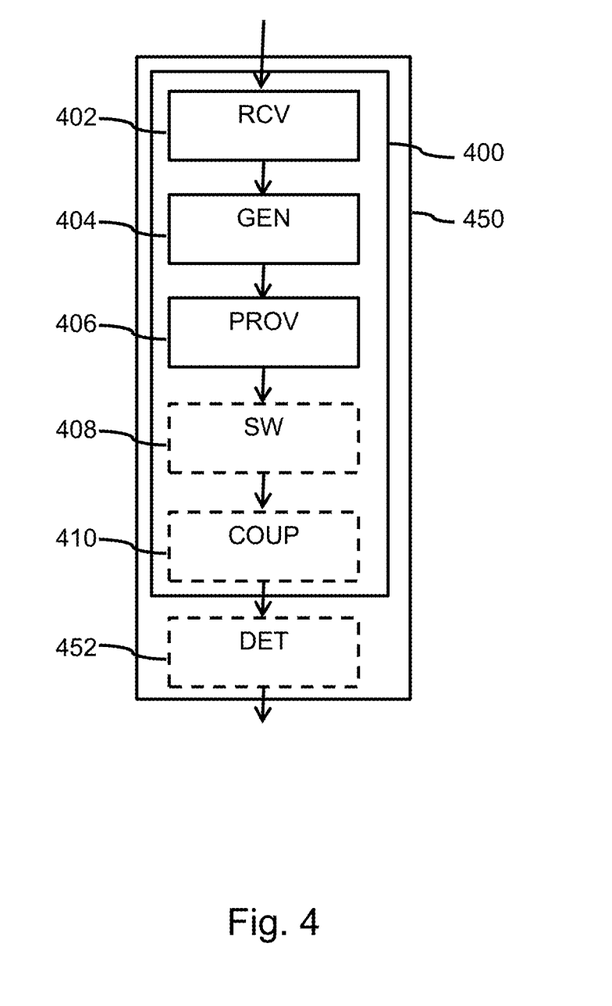

FIG. 4 schematically shows an example of an embodiment of a method 400 of providing a controllable test clock signal to sub-circuitry of a mixed mode integrated circuit and an example of an embodiment of a method 450 of detecting current paths causing EMC problems in a mixed mode integrated circuit.

The method 400 relates to providing a controllable test clock signal to a sub-circuitry of a mixed mode integrated circuit. The mixed mode integrated circuit comprises an analogue sub-circuitry, a digital sub-circuitry and a clock network that comprises at least one oscillator. The clock network comprising a clock input and being arranged to provide a first clock signal to the analogue sub-circuitry and a second clock signal to the digital sub-circuitry on basis of a clock signal received at the clock input. The method comprises i) receiving RCV, 402 an input test clock signal having a controllable frequency; ii) generating GEN, 404 a first test clock signal and/or a second test clock signal on basis of the input test clock signal; iii) providing PROV, 406 the first test clock signal to the analogue sub-circuitry instead of the first clock signal and/or providing the second test clock signal to the digital sub-circuitry instead of the second clock signal. Optionally, the analogue and the digital sub-circuitry are coupled to a power supply of the mixed mode integrated circuit and the method 400 further comprises iv) switching the analogue sub-circuitry or the digital sub-circuitry in an off-state; and v) coupling a matched load to the power supply in parallel to the switched off sub-circuitry, wherein an impedance of the matched load is selected to provide a DC load to the power supply that is about equal to a DC load of the switched off sub-circuitry in normal operation. The method 400 of providing a controllable test clock signal to sub-circuitries of a mixed mode integrated circuit has corresponding embodiments to the embodiments of the previously discussed mixed-mode integrated circuit and has corresponding effects and advantages.

The method 450 of detecting current paths causing EMC problems in a mixed mode integrated circuit comprises an embodiment of the above discussed method 400 of providing a controllable test clock signal to a sub-circuitry of a mixed mode integrated circuit and further comprising detecting DET, 452 currents paths causing EMC problems in one of the analogue sub-circuitry or the digital sub-circuitry when at least one of the analogue sub-circuitry and the digital sub-circuitry receives the first test clock signal and the second clock signal, respectively. This detecting DET, 452 can be performed by use of known method of detecting current paths that cause EMC problems—also the earlier discussed TRI technology can be used in detecting DET, 452 which current paths cause EMC problems.

The above method 400 of providing a controllable test clock signal to sub-circuitries of a mixed mode integrated circuit and method 450 of detecting current paths causing EMC problems in a mixed mode integrated circuit can also be applied to an integrated circuit design that represents the mixed mode integrated circuit. When the method is applied to an integrated circuit design, the stages of the method may be performed during a simulation of the behaviour of the mixed mode integrated circuit.

Figure 5:
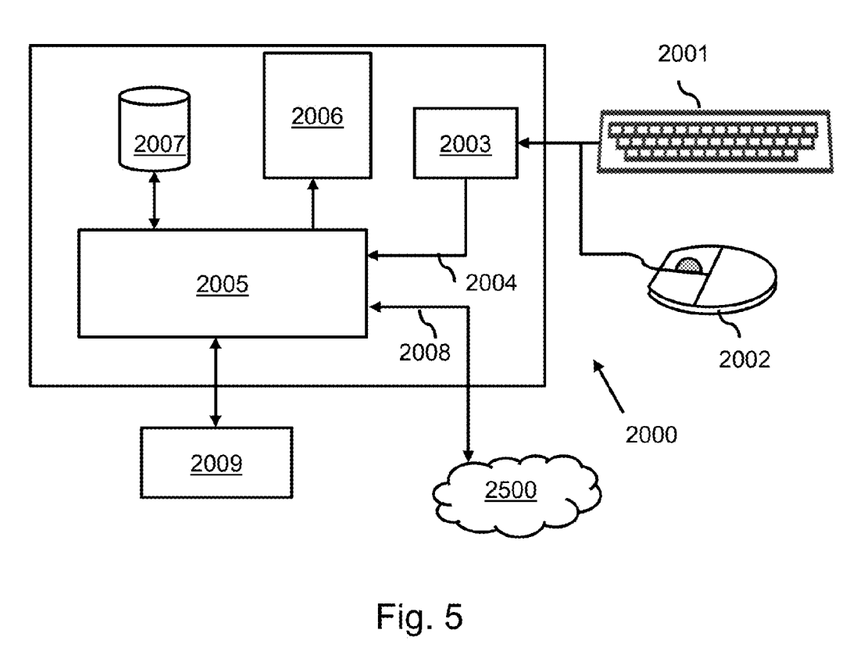

FIG. 5 schematically shows an exemplary user interaction system 2000 having a programmable processor 2005. The user interaction system 2000 is shown to be a personal computer, but may be any type of suitable user interaction system 2000. The programmable processor may comprise one or more components of system 11. The user interaction system 2000 further comprises a storage unit 2007, a user input 2003 and a display 2006. The user input 2003 allows the user to input user data and user instructions 2004 to the processor 2005 by e.g. using a keyboard 2001 or a mouse 2002. Also, although not shown, the display 2006 may comprise a touch-sensitive surface for enabling the user to provide user data and user instructions to the user input 2003 by means of touching the display 2006. The processor 2005 is arranged to perform any one of the embodiments of the above discussed methods, to receive user data and user instructions 2004, to present visual information on the display 2006 and to communicate with a data I/O device 2009, such as an optical disc drive or a solid state reader/writer. The processor 2005 is arranged to cooperate with the storage unit 2007, allowing storing and retrieving information on the storage unit 2007, such as for example an integrated circuit design of an embodiment of the above discussed mixed mode integrated circuit. The user interaction system 2000 may further comprise a communication channel 2008 allowing the processor 2005 to connect to an external cloud 2500 for communicating with other devices in the cloud. The external cloud may e.g. be the Internet. The user interaction system 2000 may, for example, allow a user to start one of the previously discussed methods, to select an integrated circuit design to which the method must be applied and to control parameters of the above discussed method. The processor 2005 may also be arranged to retrieve the integrated circuit design determined during executions of one of the embodiments of the earlier discussed methods from the storage unit 2007, or from another device in the cloud 2500, and generate a report by the processor 2005. The processor 2005 may be capable to read, using the data I/O device 2009, a computer readable medium comprising a program code. The processor 2005 may be capable to read, using the data I/O device 2007, a computer readable medium comprising a computer program product comprising instructions for causing the user interaction system 2000 to perform a method of providing a controllable test clock signal to a sub-circuitry of a mixed mode integrated circuit or a method of detecting current paths causing EMC problems in a mixed mode integrated circuit. The mixed mode integrated circuit comprising an analogue sub-circuitry and a digital sub-circuitry, a clock network comprising a clock input and being arranged to provide a first clock signal to the analogue sub-circuitry and a second clock signal to the digital sub-circuitry on basis of a clock signal received at the clock input. The method of providing a controllable test clock signal to a sub-circuitry of a mixed mode integrated circuit comprises receiving an input test clock signal having a controllable frequency; generating a first test clock signal and/or a second test clock signal on basis of the input test clock signal; and providing the first test clock signal to the analogue sub-circuitry instead of the first clock signal and/or providing the second test clock signal to the digital sub-circuitry instead of the second clock signal. The method of detecting current paths causing EMC problems in a mixed mode integrated circuit comprises the method of providing a controllable test clock signal to sub-circuitries of a mixed mode integrated circuit and the method comprises detecting currents paths causing EMC problems in one of the analogue sub-circuitry or the digital sub-circuitry when at least one of the analogue sub-circuitry and the digital sub-circuitry receives the first test clock signal and the second clock signal, respectively.

The above discussed user interaction system 2000 performs an action of a simulation system that comprises a simulation engine. The simulation engine is arranged to execute the above discussed methods. The user interaction system 2000 is a typical example of a programmable simulation engine that can be used for several different simulations. In another embodiment, the simulation system that comprises a simulation engine to perform one of the above discussed method may also be a dedicated piece of hardware that has a dedicated simulation engine that performs the functions of the above discussed methods.

Figure 6:
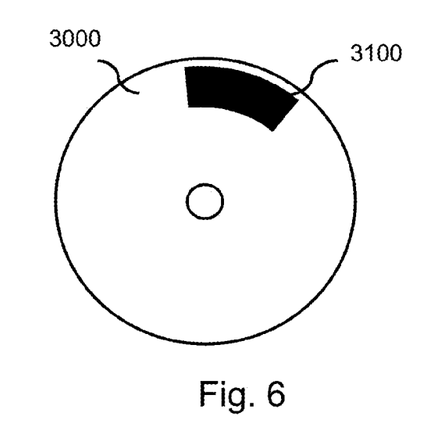
FIG. 6 shows an example of an embodiment of a non-transitory tangible computer readable storage medium comprising a computer program product.

FIG. 6 shows a non-transitory tangible computer readable storage medium 3000 comprising data loadable in a programmable apparatus, the data presenting instructions executable by the programmable apparatus. Said instruction comprising i) one or more receiving instructions for receiving an integrated circuit design representing a mixed mode integrated circuit, the mixed mode integrated circuit comprising an analogue sub-circuitry and a digital sub-circuitry, a clock network comprising a clock input and being arranged to provide a first clock signal to the analogue sub-circuitry and a second clock signal to the digital sub-circuitry on basis of a clock signal received at the clock input; ii) one or more further receiving instructions for receiving an input test clock signal having a controllable frequency; iii) one or more generating instructions for generating a first test clock signal and/or a second test clock signal on basis of the input test clock signal; iv) one or more providing instructions for providing the first test clock signal to the analogue sub-circuitry instead of the first clock signal and/or providing the second test clock signal to the digital sub-circuitry instead of the second clock signal. The data, and thus, the instructions represent a computer program product 3100 for causing the processor apparatus to perform one of the above discussed methods. The computer program product 3100 and data may be embodied on the computer readable medium 3000 as physical marks or by means of magnetization of the computer readable medium 3000. However, any other suitable embodiment is conceivable as well. Furthermore, it will be appreciated that, although the computer readable medium 3000 is shown in FIG. 6 as an optical disc, the computer readable medium 3000 may be any suitable computer readable medium, such as a hard disk, solid state memory, flash memory, etc., and may be non-recordable or recordable.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may further be a data connection, such as a telephone cable or a wireless connection.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

The computer readable media 3000 may be permanently, removably or remotely coupled to an information processing system such as user interaction system 2000. The computer readable media 3000 may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

In one embodiment, user interaction system 2000 is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

In the foregoing specification, the invention has been described with reference to specific examples of embodiments of the invention. It will, however, be evident that various modifications and changes may be made therein without departing from the scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Each signal described herein may be designed as positive or negative logic or may be an analogue signal. Negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details have not been explained in any greater extent than that considered necessary, for the understanding and appreciation of the underlying concepts of the present invention and in order not to obfuscate or distract from the teachings of the present invention.

Furthermore, although FIGS. 1, 2 and 3 and the discussion thereof describe an exemplary architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "coupled", "operably connected," or "operably coupled," to each other to achieve the desired functionality.

Also for example, in one embodiment, the illustrated elements of the mixed-mode integrated circuit 100 of FIG. 1 or 300 of FIG. 3 are circuitry located on a single integrated circuit or within a same device. Alternatively, the mixed mode integrated circuits 100, 300 may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. For example, Also, devices functionally forming separate devices may be integrated in a single physical device. Also, the units and circuits may be suitably combined in one or more semiconductor devices.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A mixed mode integrated circuit being adapted for electromagnetic compatibility testing, the mixed mode integrated circuit comprising:
    an analogue sub-circuitry;
    a digital sub-circuitry;
    a clock network comprising a clock input and being arranged to provide a first clock signal and a second clock signal in response to a clock signal received at the clock input;
    an integrated test clock signal generator being arranged to generate a first test clock signal and to generate a second test clock signal in response to an input test clock signal having a controllable frequency, the first test clock signal and the second test clock signal having a controllable frequency that relates to the controllable frequency of the input test clock signal;
    a first controllable clock multiplexer coupled to the first clock signal and to the first test clock signal and being arranged to provide either the first clock signal or the first test clock signal to the analogue sub-circuitry; and
    a second controllable clock multiplexer coupled to the second clock signal and to the second test clock signal and being arranged to provide either the second clock signal or the second test clock signal to the digital sub-circuitry.

2. The mixed mode integrated circuit according to claim 1, wherein the integrated test clock signal generator comprises a delay phasing generator being arranged to control a phase of at least one of the first test clock signal and the second test clock signal.

3. The mixed mode integrated circuit according to claim 2, wherein the delay phasing generator comprises
    a first series arrangement of clock delay circuitries, the first series arrangement being coupled between an input receiving the input test clock signal and an output providing the first test clock signal;
    a plurality of controllable switches each being arranged parallel to one clock delay circuitry of the first series arrangement of clock delay circuitries for short circuiting an input and an output of the one clock delay circuitry in dependence of a control signal from a first set of control signals; and
    a controller being arranged to provide the first set of control signals to the plurality of controllable switches for controlling the controllable phase of the first test clock signal.

4. The mixed mode integrated circuit according to claim 1, wherein the delay phasing generator comprises
    a second series arrangement of clock delay circuitries, the second series arrangement being coupled between an input receiving the input test clock signal and an output providing the second test clock signal;
    a plurality of further controllable switches each being arranged parallel to one clock delay circuitry of the second series arrangement of clock delay circuitries for short circuiting an input and an output of the one clock delay circuitry in dependence of a control signal from a second set of control signals; and
    the delay phasing generator comprises a controller being arranged to provide the second set of control signals to the plurality of controllable switches for controlling the controllable phase of the second test clock signal.

5. The mixed mode integrated circuit according to claim 3 wherein the controller comprises a fuse matrix for coupling the control signals of the first set of control signals and/or the control signals of the second set of control signals to a first control voltage or a second control voltage, the fuse matrix comprises fuses being arranged in a matrix and being arranged to be disabled by a high current.

6. The mixed mode integrated circuit according to claim 1 wherein the analogue sub-circuitry and the digital sub-circuitry are coupled to a power supply,
    the mixed mode integrated circuit further comprising a first matched load, a second matched load, a first controllable switch and a second controllable switch;
    a series arrangement of the first matched load and the first controllable switch is coupled to the power supply and is arranged parallel to the analogue sub-circuitry;
    a series arrangement of the second matched load and the second controllable switch is coupled to the power supply and is arranged parallel to the digital sub-circuitry;
    wherein an impedance of the first matched load is selected to provide, when the first controllable switch is controlled in a conducting state, a dc load to the power supply that is substantially equal to a dc load of the analogue sub-circuitry in normal operation; and
    an impedance of the second matched load is selected to provide, when the second controllable switch is controlled in a conducting state, a dc load to the power supply that is about equal to a dc load of the digital sub-circuitry in normal operation.

7. The mixed mode integrated circuit according to claim 6, further comprising a sub-circuitry on/off controller being arranged to control the analogue sub-circuitry and/or the digital sub-circuitry in an on mode or an off mode, to control the first controllable switch in the conducting state when the analogue sub-circuitry is controlled in the off mode and to control the second controllable switch in the conducting state when the digital sub-circuitry is controlled in the off-mode.

8. The mixed mode integrated circuit according to claim 1 further comprising a further analogue circuit and a third controllable clock multiplexer, the clock network being further arranged to provide a third clock signal, the integrated test clock signal generator being further arranged to generate a third test clock signal, the third controllable clock multiplexer being coupled to the third clock signal and to the third test clock signal and being arranged to provide either the third clock signal or the third test clock signal to the further analogue sub-circuitry.

9. The mixed mode integrated circuit according to claim 1 further comprising a further digital circuit and a fourth controllable clock multiplexer, the clock network being further arranged to provide a fourth clock signal, the integrated test clock signal generator being further arranged to generate a fourth test clock signal, the fourth controllable clock multiplexer being coupled to the fourth clock signal and to the fourth test clock signal and being arranged to provide either the fourth clock signal or the fourth test clock signal to the further digital sub-circuitry.

10. An integrated circuit design of the mixed mode integrated circuit according to claim 1.

11. A method of providing a controllable test clock signal to a sub-circuitry of a mixed mode integrated circuit, the mixed mode integrated circuit comprising an analogue sub-circuitry and a digital sub-circuitry, a clock network comprising a clock input, the method comprises:
  providing, by the clock network, a first clock signal and a second clock signal in response to a clock signal received at the clock input;
  receiving an input test clock signal having a controllable frequency;
  generating, by an integrated test clock signal generator, a first test clock signal and a second test clock signal based on the input test clock signal, the first test clock signal and the second test clock signal having a controllable frequency that relates to the controllable frequency of the input test clock signal; and
  providing, by a first controllable clock multiplexer, either the first test clock signal or the first clock signal to the analogue sub-circuitry, wherein the first controllable clock multiplexer coupled to the first clock signal and to the first test clock signal; and
  providing, by a second controllable clock multiplexer, either the second test clock signal or the second clock signal to the digital sub-circuitry, wherein second controllable clock multiplexer coupled to the second clock signal and to the second test clock signal.

12. The method of providing a controllable test clock signal to sub-circuitries of a mixed mode integrated circuit according to claim 11, the analogue sub-circuitry and the digital sub-circuitry being coupled to a power supply of the mixed-mode integrated circuit, the method further comprising
  switching the analogue sub-circuitry or the digital sub-circuitry in an off-state; and
  coupling a matched load to the power supply in parallel to said switched off analogue or digital sub-circuitry, wherein an impedance of the matched load is selected to provide a dc load to the power supply that is substantially equal to a dc load of the switched off sub-circuitry in normal operation.

13. The method of detecting current paths causing violations of for electromagnetic compatibility standards in a mixed mode integrated circuit, the method comprises the method of providing a controllable test clock signal to sub-circuitries of a mixed mode integrated circuit according to claim 11 and the method comprises detecting currents paths causing the violations of for electromagnetic compatibility standards in one of the analogue sub-circuitry or the digital sub-circuitry when at least one of the analogue sub-circuitry and the digital sub-circuitry receives the first test clock signal and the second clock signal, respectively.

14. A non-transitory computer program product comprising instructions for causing a programmable apparatus to perform a method of providing a controllable test clock signal to sub-circuitries of a mixed mode integrated circuit the method comprising:
  receiving an integrated circuit design representing a mixed mode integrated circuit, the mixed mode integrated circuit comprising an analogue sub-circuitry and a digital sub-circuitry, a clock network comprising a clock input;
  providing, by the clock network, a first clock signal and a second clock signal in response to a clock signal received at the clock input;
  receiving an input test clock signal having a controllable frequency;
  generating, by an integrated test clock signal generator, a first test clock signal and a second test clock signal based on the input test clock signal, the first test clock signal and the second test clock signal having a controllable frequency that relates to the controllable frequency of the input test clock signal;
  providing, by a first controllable clock multiplexer, either the first test clock signal or the first clock signal to the analogue sub-circuitry, wherein the first controllable clock multiplexer coupled to the first clock signal and to the first test clock signal; and
  providing, by a second controllable clock multiplexer, either the second test clock signal or the second clock signal to the digital sub-circuitry, wherein second controllable clock multiplexer coupled to the second clock signal and to the second test clock signal.

15. The non-transitory computer program product according to claim 14, wherein the method further comprises detecting currents paths causing violations of electromagnetic compatibility standards in one of the analogue sub-circuitry or the digital sub-circuitry when at least one of the analogue sub-circuitry and the digital sub-circuitry receive the first test clock signal and the second clock signal, respectively.

16. A non-transitory tangible computer readable storage medium comprising data loadable in a programmable apparatus, the data representing instructions executable by the programmable apparatus, said instructions comprising:
  one or more receiving instructions for receiving an integrated circuit design representing a mixed mode integrated circuit, the mixed mode integrated circuit comprising an analogue sub-circuitry and a digital sub-circuitry, a clock network comprising a clock input and being arranged to provide a first clock signal to the analogue sub-circuitry and a second clock signal to the digital sub-circuitry on basis of a clock signal received at the clock input;
  one or more further receiving instructions for receiving an input test clock signal having a controllable frequency;
  one or more generating instructions for generating, by an integrated test clock signal generator, a first test clock signal and a second test clock signal on basis of the input test clock signal, the first test clock signal and the second test clock signal having a controllable frequency that relates to the controllable frequency of the input test clock signal;
  one or more providing instructions for providing, by a first controllable clock multiplexer, either the first test clock signal or the first clock signal to the analogue sub-circuitry, wherein the first controllable clock multiplexer coupled to the first clock signal and to the first test clock signal; and
  providing, by a second controllable clock multiplexer, either the second test clock signal or the second clock signal to the digital sub-circuitry, wherein second controllable clock multiplexer coupled to the second clock signal and to the second test clock signal.

17. The non-transitory tangible computer readable storage medium according to claim 16, said instructions further comprising
  one or more detecting instructions for detecting currents paths causing violations of electromagnetic compatibility standards in one of the analogue sub-circuitry or the digital sub-circuitry when at least one of the analogue sub-circuitry and the digital sub-circuitry receive the first test clock signal and the second clock signal, respectively.

* * * * *